(12) United States Patent  (10) Patent No.: US 7,213,330 B2
Caldwell et al.  (45) Date of Patent: May 8, 2007

(54) METHOD OF FABRICATING AN ELECTRONIC DEVICE

(75) Inventors: John L. Caldwell, Meridian, ID (US); William J. Casey, Boise, ID (US)

(73) Assignee: Micron Technology, Inc., Boise, ID (US)

(*) Notice: Subject to any disclaimer, the term of this patent is extended or adjusted under 35 U.S.C. 154(b) by 165 days.

(21) Appl. No.: 10/921,422

(22) Filed: Aug. 17, 2004

(65) Prior Publication Data

US 2005/0011660 A1 Jan. 20, 2005

Related U.S. Application Data

(62) Division of application No. 10/216,580, filed on Aug. 8, 2002, now Pat. No. 6,974,330.

(51) Int. Cl.
*H05K 3/30* (2006.01)

(52) U.S. Cl. ............................. 29/832; 29/831; 29/833; 29/834; 29/842; 29/846; 29/857; 29/877; 439/66; 439/71; 174/52.1

(58) Field of Classification Search ............ 29/832, 29/842, 831, 857, 846, 833, 834, 877; 439/62, 439/66, 71; 257/738, 778, 734, 698; 361/773, 361/774, 400, 403; 438/108, 612, 613, 617; 174/52.1
See application file for complete search history.

(56) References Cited

U.S. PATENT DOCUMENTS

| 4,581,680 A | 4/1986 | Garner |
| 4,582,975 A | 4/1986 | Daughton |
| 4,744,764 A * | 5/1988 | Rubenstein .................. 439/62 |
| 4,878,611 A | 11/1989 | Lo Vasco et al. |
| 5,371,654 A * | 12/1994 | Beaman et al. ............. 361/744 |
| 5,586,010 A | 12/1996 | Murtuza et al. |
| 5,641,990 A | 6/1997 | Chiu |
| 5,831,336 A | 11/1998 | DiGiacomo |
| 5,950,907 A | 9/1999 | DiGiacomo |
| 5,956,606 A | 9/1999 | Burnette |
| 5,990,418 A | 11/1999 | Bivona et al. |
| 6,016,947 A | 1/2000 | Donahue et al. |
| 6,025,649 A | 2/2000 | DiGiacomo |
| 6,046,910 A * | 4/2000 | Ghaem et al. .............. 361/760 |

(Continued)

*Primary Examiner*—A. Dexter Tugbang
*Assistant Examiner*—Tai Van Nguyen
(74) *Attorney, Agent, or Firm*—TraskBritt (57) ABSTRACT

A plurality of electrical interconnections may be formed in an electrical device including a first component having a plurality of contact pads and a second component having a plurality of contact pads. The two components are placed in a confronting spaced relationship such that each contact pad of the first component locationally corresponds to one of the contact pads of the second component. The contact pads of the second component are further arranged such that at least two of the contact pads are laterally offset relative to their locationally corresponding contact pads on the first component with one of the at least two contact pads being offset in a first direction while the other is offset in another direction. A mass of conductive material is disposed between each contact pad of the first component and its corresponding contact pad of the second component. The masses of conductive material may be formed into columnar members wherein the columnar members are skewed when formed between a pair of relatively offset contact pads.

16 Claims, 8 Drawing Sheets

U.S. PATENT DOCUMENTS

| | | |
|---|---|---|
| 6,084,297 A | 7/2000 | Brooks et al. |
| 6,097,098 A * | 8/2000 | Ball ........................... 257/786 |
| 6,182,884 B1 | 2/2001 | Ma et al. |
| 6,196,443 B1 | 3/2001 | DiGiacomo |
| 6,222,277 B1 | 4/2001 | Downes |
| 6,259,155 B1 | 7/2001 | Interrante et al. |
| 6,274,474 B1 | 8/2001 | Caletka et al. |
| 6,310,403 B1 * | 10/2001 | Zhang et al. ............... 257/786 |
| 6,329,721 B1 | 12/2001 | DiGiacomo |
| 6,335,222 B1 | 1/2002 | DiStefano |

* cited by examiner

METHOD OF FABRICATING AN ELECTRONIC DEVICE

CROSS-REFERENCE TO RELATED APPLICATION

This application is a divisional of application Ser. No. 10/216,580 filed Aug. 8, 2002, now U.S. Pat. No. 6,974,330, issued Dec. 13, 2005.

BACKGROUND OF THE INVENTION

1. Field of the Invention

The present invention relates generally to electrical interconnections and, more particularly, electrical interconnections having improved reliability when, for example, they are formed between two components exhibiting different coefficients of thermal expansion (CTE).

2. State of the Art

Various types of electrical interconnections are used to operably couple one or more components of an electrical device. For example, semiconductor devices are often electrically connected to other components such as carrier substrates or other higher-level packaging through solder-type interconnections. While numerous types of solder-type and other electrical interconnections exist, one technique which has become conventional in the industry includes flip chip bonding which includes a variant known as controlled collapse chip connection or "C4" bonding. With the C4 technique, individual masses of solder are provided on the contact pads of the semiconductor device or the carrier substrate prior to assembly of the two components. During assembly, the solder masses are reflowed by bringing them to an elevated reflow temperature sufficient to melt or at least partially melt the solder. The assembly is then cooled, leaving soldered electrical interconnections between the contact pads of the chip and corresponding contact pads of the carrier substrate. In conventional interconnecting techniques wherein the electrical interconnections are formed in an arrayed pattern, such as in ball grid array (BGA) or column grid array (CGA) devices, the contact pads (also referred to as bond pads) of the semiconductor device correspond locationally and are aligned with a mirrored array of contact or terminal pads on the carrier substrate. The term "contact pads," as used herein pertaining to semiconductor devices, includes not only bond pads but also I/O connections for the device rerouted from bond pad locations into, for example, an array.

Solder bonds such as those described above are conventionally subjected to thermally induced fatigue stress under normal operating conditions. For example, electrical power supplied to a packaged semiconductor device and signals input to and output therefrom, as well as transitions between passive and active operational states of the semiconductor device, each tend to cause a thermal cycling of the package as temperatures within the package rise and fall. Such a semiconductor device package, including the electrical interconnections associated therewith, also experiences thermal cycling during various fabrication and testing processes, including, without limitation, burn-in of the semiconductor device.

It is often the case that a semiconductor device and the other electronic component to which it is attached for operation are formed of different materials and, therefore, exhibit different CTEs. Thus, different components of a given electronic device assembly may expand or contract at varied and substantially independent rates, which often results in thermally induced stress in the electrical interconnections (e.g., the solder joints) formed between such components. For example, a semiconductor device may expand and contract at a first rate while a carrier substrate to which it is attached through the electrical interconnections may expand and contract at another, different rate. In such a case, the electrical interconnections (e.g., solder-type connections) which also form a mechanical interconnection of the semiconductor device to the carrier substrate, are placed in repeated cycles of tension and/or compression. Such cycles of stress eventually lead to a fatigue-type failure in one or more of the electrical interconnections, which may cause an open circuit and operation failure of the electronic device assembly.

Even in the case where the connected components (e.g., the semiconductor device and the carrier substrate) exhibit similar CTEs, heat transfer within the electronic device assembly components and between the assembly and the ambient environment will not necessarily be uniform due to the configuration of the assembly and differing heat transfer rates of portions of each of the components thereof and, thus, different components of the electronic device assembly will still likely experience differing relative rates of expansion and contraction.

Various attempts have been made to alleviate fatigue-related failures in electrical connections. One such attempt has been to provide a mechanically stronger interconnection such as with ceramic column grid array (CCGA) technology. CCGA technology relies on solder columns formed of a 90Pb (lead)-10Sn (tin) solder composition (90% lead and 10% tin). Such a composition exhibits a high melting temperature and thus is used in conjunction with ceramic materials (e.g., substrates) which may be subjected to elevated temperatures during various process steps. Furthermore, individual columns are conventionally attached to the contact pads of the chip or carrier substrate with a different solder composition. For example, at least one end of a solder column may be attached to an associated contact pad using a 63Sn-37Pb solder composition because of the latter's lower melting point. However, the melding of two different solder compositions creates the possibility of discontinuities and localized stresses at the interface between the solder column and the contact pad.

Furthermore, the use of different materials and processing equipment required to form CCGA-type connections can increase the fabrication costs of electronic and semiconductor devices.

Another technique which has been used in an attempt to alleviate temperature-induced fatigue failures of electrical interconnections is to draw out, or elongate, a solder-type connection under the premise that a solder connection having a narrowed, or necked, midsection relieves stress concentrations at the solder-contact pad interface. Such a technique is taught in U.S. Pat. No. 6,335,222 to DiStefano, issued Jan. 1, 2002.

The DiStefano patent teaches a technique of joining two components, each having a plurality of contact pads on a surface thereof, by disposing a mass of solder between corresponding contact pads of the two components and heating the solder to a temperature above the recrystallization temperature thereof. With the solder in a partially liquid state, the two components are drawn apart, or displaced from one another in a direction which is transverse to the plane of the array of solder connections, to elongate each of the solder connections. The drawing apart or relative displacement of the two components may be accomplished by forming a seal between the peripheries of the two components and then introducing a fluid pressure between the opposing surfaces of the components.

The DiStefano patent further discloses that in lieu of, or in addition to, drawing the two components from one another in a direction transverse to the plane of the array of solder connections, the two components may be relatively displaced in a direction which is parallel with the plane in which the array of solder connections is disposed. Such a parallel displacement causes a shift in the angle at which the elongated solder connection is formed. The DiStefano patent does not appear to teach any substantial benefits to skewing the angle of the elongated solder connections, but rather seems to simply consider such as an alternative or additional technique for forming the elongated solder connection having a thinned midsection.

It is noted that in forming an elongated solder connection having a skewed angle according to the method taught by DiStefano (i.e., through the relative displacement of components in a parallel direction with respect to the plane in which the array of solder connections is formed), all the solder connections are formed to exhibit similar angles relative to the plane parallel to the array of connections as well as exhibiting a common "azimuth" or orientation relative to the same plane.

Furthermore, regardless of whether the two components are drawn apart from one another or shifted horizontally relative to one another, both components must be held captive during the assembly process (at least until the solder is sufficiently hardened) and additional equipment having precision dimensional displacement control would likely be required to effect the displacement process. Such is contrary to more conventional solder connection techniques wherein typically only one of the components is required to be held captive during formation of the solder connections.

In view of the shortcomings in the current state of the art, it would be advantageous to provide a new electrical interconnection and method of forming such an electrical interconnection which improves reliability, particularly with respect to thermally induced fatigue developed within assemblies of electronic components.

It would further be advantageous if such an electrical interconnection and associated method of fabrication could be easily incorporated into existing manufacturing processes without requiring new or additional equipment or additional process expenses. Similarly, it would be advantageous if such an electrical interconnection could be formed using materials and material compositions conventionally used in the art.

BRIEF SUMMARY OF THE INVENTION

In accordance with one aspect of the invention an electronic device assembly is provided. The electronic device assembly includes a first component having a face surface and at least a first contact pad and a second contact pad disposed along the face surface. A second component also has a face surface which is positioned to be in a confronting and spaced-apart relationship with the face surface of the first component. The second component includes at least a first contact pad and a second contact pad disposed along the face surface thereof.

The first contact pad of the second component is laterally offset from the first contact pad of the first component in a first direction. The second contact pad of the second component is laterally offset from the second contact pad of the second component in a second direction which is different from the first direction. A first mass of conductive material is disposed between and coupled with the first contact pad of the first component and the first contact pad of the second component and a second mass of conductive material is disposed between and coupled with the second contact pad of the first component and the second contact pad of the second component.

A majority, or even all, of the contact pads of the second component may be laterally offset relative to their associated contact pads of the first component. The laterally offset pairs of contact pads may be arranged to be symmetrical about a defined axis of the electronic device assembly, or to be symmetrical about the device assembly's center.

The first component may include, for example, a semiconductor device such as a semiconductor die bearing integrated circuitry thereon while the second component may include, for example, a carrier substrate. The masses of conductive material may include, for example, gold or solder or another specified conductive composition.

In accordance with another aspect of the present invention, another electronic device assembly is provided. The electronic device assembly includes a first component having a first plurality of contact pads patterned on a face surface thereof. A second component has a second plurality of contact pads patterned on a face surface thereof. The face surface of the first component is positioned in a confronting, spaced relationship with the face surface of the second component such that each of the second plurality of contact pads corresponds with, but is laterally offset relative to, an associated one of the first plurality of contact pads.

A plurality of columnar members is formed of a conductive material with each columnar member being coupled between a contact pad of the second plurality of contact pads and its associated contact pad of the first plurality of contact pads. At least one column member is skewed in a first direction, and at least one other column member is skewed in a second direction different from the first direction.

A greater plurality of columnar members may be skewed with a first portion skewed in the first direction and a second portion skewed in the second direction. The skewed columnar members may be symmetrically arranged about a defined axis of the electronic device assembly or about the electronic device assembly's center if so desired.

In accordance with another aspect of the invention, another electronic device assembly is provided. The electronic device assembly includes a first component having a first plurality of contact pads on a face surface thereof. A plurality of columnar members is provided, wherein a first end of each columnar member is coupled with an individual contact pad of the first plurality. A second component has a second plurality of contact pads on a face surface thereof with each contact pad of the second plurality being coupled with a second end of an individual columnar member. At least one columnar member is skewed in a first direction and at least one other column member is skewed in a second direction different from the first direction.

In accordance with yet another aspect of the present invention, a method is provided for fabricating an electronic device assembly. The method includes providing a first component having a first plurality of contact pads patterned on a face surface thereof. A second component having a second plurality of contact pads patterned on a face surface thereof is also provided.

Providing the second component further includes arranging each of the second plurality of contact pads to correspond with an associated one of the first plurality of contact pads when the face surface of the second component is placed in a confronting spaced relationship with the face surface of the first component; laterally offsetting a first contact pad of the second plurality of contact pads relative to its associated one of the first plurality of contact pads in a first direction; and laterally offsetting a second contact pad of the second plurality of contact pads relative to its associated one of the first plurality of contact pads in a second direction different from the first direction.

The method further comprises forming a plurality of conductive columnar members, wherein each conductive columnar member of the plurality interconnects a contact pad of the second plurality of contact pads and its associated contact pads of the first plurality of contact pads.

BRIEF DESCRIPTION OF THE SEVERAL VIEWS OF THE DRAWINGS

The foregoing and other advantages of the invention will become apparent upon reading the following detailed description and upon reference to the drawings in which.

DETAILED DESCRIPTION OF THE INVENTION

Figure 1A:
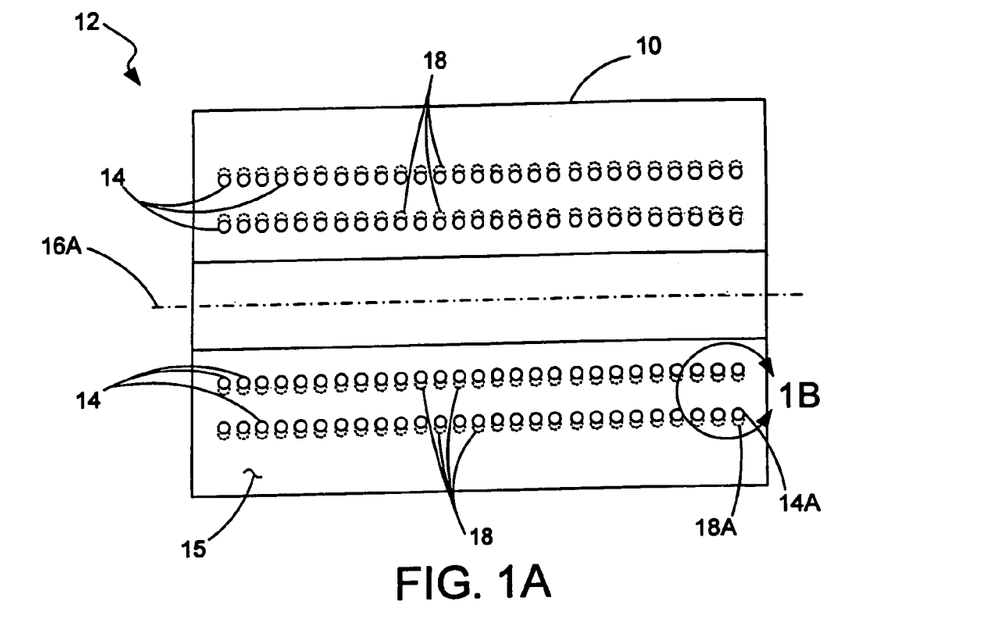
FIG. 1A is a top plan view of an electronic device having an array of contact pads and showing the superimposed location of corresponding contact pads from a mating component according to an embodiment of the present invention.
Figure 1B:
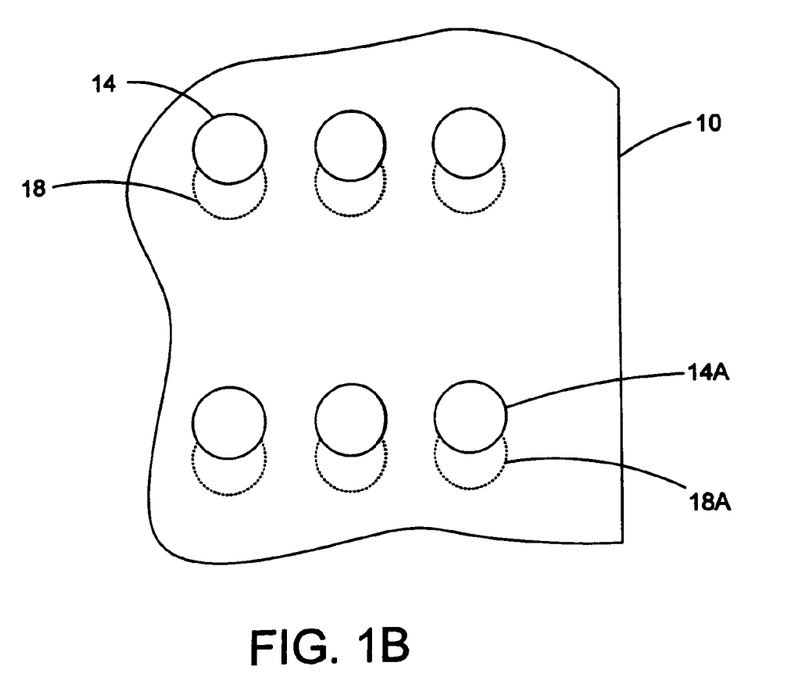
FIG. 1B is an enlarged detail of a section of the electronic device as indicated in FIG. 1A.

Referring to FIGS. 1A and 1B, a first component 10 of an electronic device assembly, which may also be termed simply an "electronic device" 12 for simplicity, is shown. The first component may be, for example, a semiconductor device such as a semiconductor die bearing integrated circuitry on an active surface thereof. The first component 10 includes an array of electrical contact pads 14 formed on a face surface 15 thereof which is arranged symmetrically about a longitudinal axis 16A, although other configurations are contemplated as shall be discussed in further detail below. The contact pads 14 act as input and output (I/O) connections to circuitry (not shown) formed in the first component 10 and are adapted to be coupled with another component or device such as, for example, a carrier substrate or another semiconductor device.

As will be appreciated by those of ordinary skill in the art, the array of contact pads 14 may be configured to mate with a corresponding array of electrical connections (such as a mirror image array of contact pads) formed on another electronic component (e.g., a carrier substrate) such as is conventional with ball grid array (BGA)-type or column grid array (CGA)-type devices. In such BGAZ- and CGA-type devices, a mass of electrically conductive material such as, for example, solder or gold, is disposed between each contact pad 14 of the first component 10 and a locationally and operationally corresponding electrical contact pad of the mating component. Conventional arrayed connections are configured such that the array of contact pads 14 on the first component 10 precisely mirrors the contact pads of a mating component in not only pattern but also spacing or pitch between contact pads for accurate and effective connection of the two components.

The present invention, however, intentionally incorporates an offset between each contact pad 14 of the first component 10 and a substantially corresponding contact pad of a mating component. For example, while neither the mating component nor masses of electrically conductive material are shown for purposes of clarity, FIGS. 1A and 1B each show the contact pads 18 (shown as broken lines) of a mating electronic component (not shown) superimposed over the contact pads 14 of the first component 10. The contact pads 18 of the mating component are configured such that they are purposefully misaligned in a specified direction relative to the contact pads 14 of the first component 10.

In the exemplary embodiment shown, the contact pads 18 of the mating component are displaced laterally outwardly from the longitudinal axis 16A and relative to contact pads 14 of the first component 10. Thus, a given contact pad 18A of the mating component is located further from the longitudinal axis 16A (which, in the embodiment shown, also defines an axis of symmetry of first component 10) than is the corresponding contact pad 14A of the first component 10. Of course the contact pads 14 and 18 may be arranged in a manner which is opposite of that shown such that the contact pad 14A (or any other contact pad 14) of the first component 10 is displaced further from longitudinal axis 16A than is the corresponding contact pad 18A (or any other contact pad 18) of the mating component.

Figure 2A:
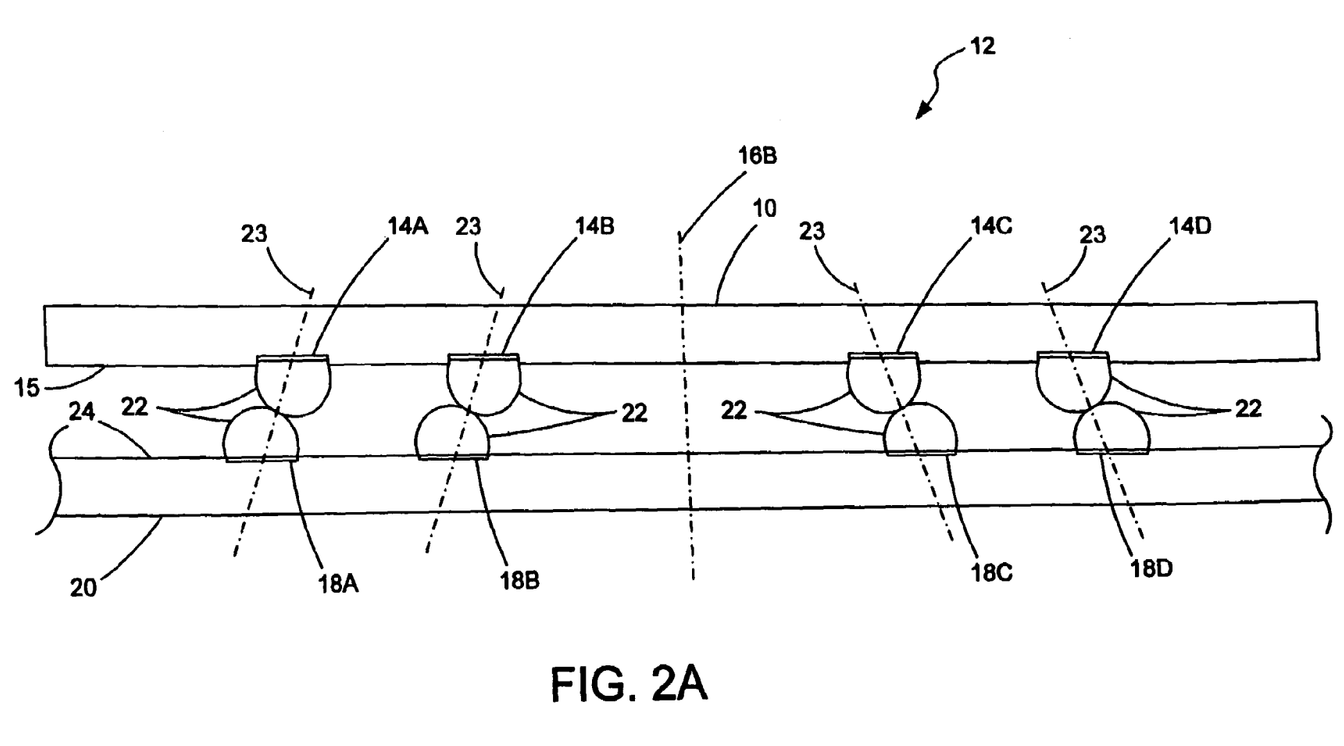
FIG. 2A is a side elevational view of an electronic device having a first component placed in contact with a mating component and during formation of the electrical interconnections between the two components according to an embodiment of the present invention.

Referring to FIG. 2A, a side elevational view of the electronic device 12 is shown wherein electrical connections between the first component 10 and a mating component 20 are in the process of being formed. As noted above, the mating component 20 may include, for example, a semiconductor device such as another semiconductor die or a carrier substrate including, for example, a printed circuit board (PCB) formed, for example, of bismaleimide-triazine (BT) resin, an FR-4 or FR-5 laminate, silicon, or other suitable material or combination of materials as known in the art. The contact pads 18A–18D of the mating component 20 are displaced outwardly from an axis 16B which runs through the center of the first component 10 and/or the electronic device 12 and which is perpendicular to the longitudinal axis 16A (see FIG. 1A). As addressed above, such an arrangement results in intentional offset between corresponding pairs of contact pads 14A–14D and 18A–18D.

Discrete masses of electrically conductive material, shown as conductive bumps 22, may be disposed on each of the contact pads 14A–14D and 18A–18D. The conductive bumps 22 may be formed of, for example, gold or solder including various solder compositions known to those of skill in the art. One exemplary solder composition includes 63Sn-37Pb (63% tin and 37% lead by weight) which, as discussed above, exhibits a relatively low melting point of approximately 183° C. It may be desirable that the conductive bumps 22 disposed on the first component 10 and those disposed on the mating component 20 be formed of materials having the same or substantially similar composition.

By utilizing the same composition of material to form conductive bumps 22 on both the first component 10 and the mating component 20, a bond exhibiting better mechanical and material integrity may be formed when corresponding conductive bumps 22 are joined such as during an elevated temperature reflow process. However, use of different materials, or differing material compositions, to form the conductive bumps 22 of the first component 10 relative to the conductive bumps 22 of the second mating component 20 is contemplated as being within the scope of the invention. For example, a conductive bump of one component may be formulated so as to not significantly melt during the reflow process, so as to wick and be partially coated by the melted material of the other, lower melting point conductive bump.

Furthermore, in other embodiments of the present invention the first component 10 may have a conductive bump 22 such as a solder mass, while the other component may include a plurality of screened-on solder paste as will be appreciated by those of ordinary skill in the art. In another embodiment, the contact pads 14A–14D and 18A–18D may remain offset, as described above herein, but with a single set of conductive bumps 22 such as, for example, flux dipped solder spheres, being initially formed on only one of the first component 10 and the mating component 20. The conductive bumps could then be reflowed or otherwise processed to form an appropriate interconnection between each set of contact pads 14A–14D and 18A–18D.

It is noted that, with the contact pads 14A–14D of the first component 10 being offset from the contact pads 18A–18D of the mating component 20, corresponding pairs of conductive bumps 22 do not align in a center-to-center fashion, but rather along axes 23 which are oriented obliquely to axis 16B as well as to the generally planar face surfaces 15 and 24 of the first component 10 and mating component 20 respectively. Similarly, while not shown, if only a single set of conductive bumps 22 were attached to, for example, the contact pads 14A–14D of the first component 10, such would not be aligned with the contact pads 18A–18D of the mating component 20.

Figure 2B:
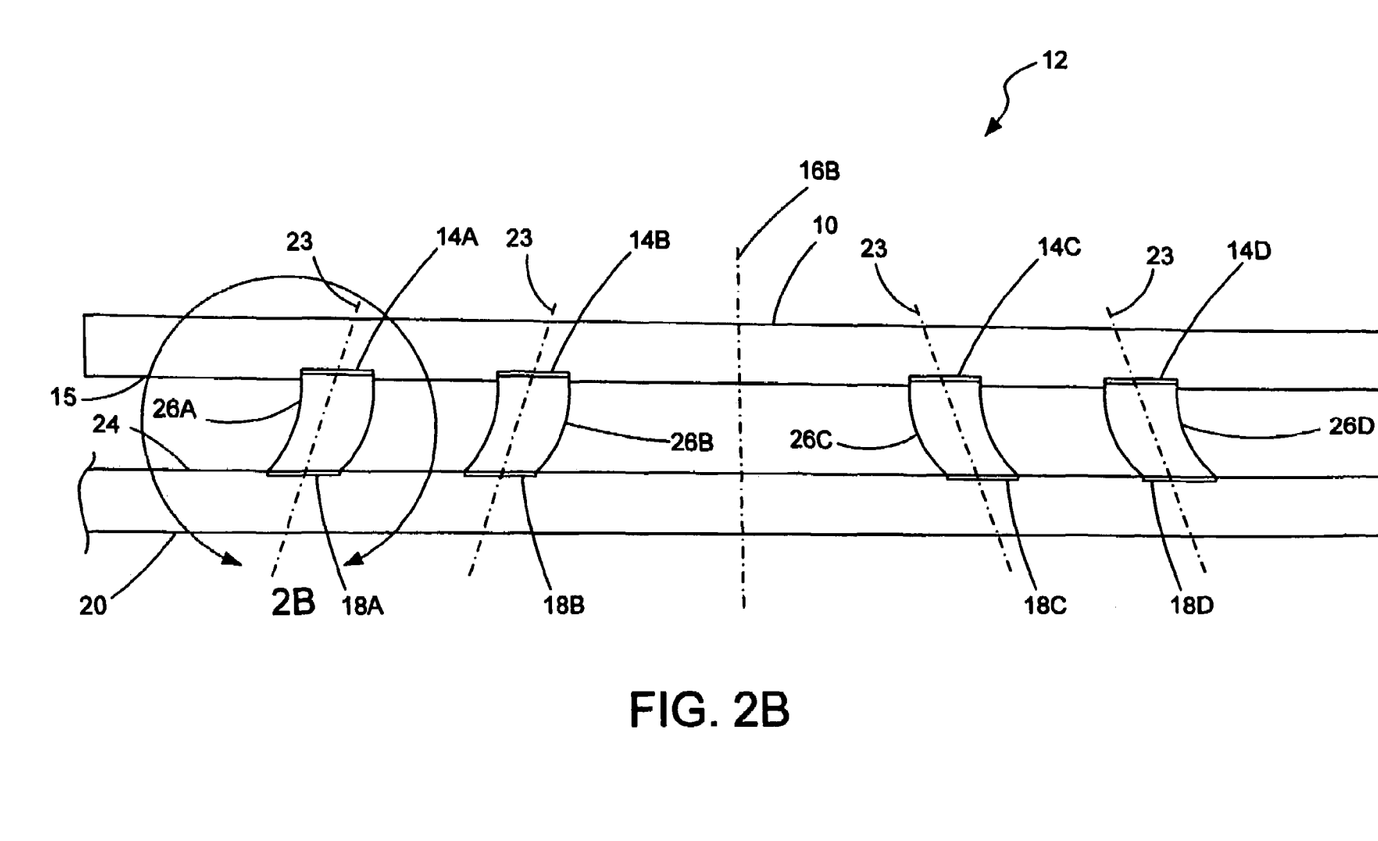
FIG. 2B is a side elevational view of the electronic device of FIG. 2A upon formation of a plurality of electrical connections between the two components.

Referring to FIG. 2B, upon joining of the conductive bumps 22 under elevated temperature conditions (e.g., compare with FIG. 2A), corresponding and contacting individual conductive bumps 22 meld together in a reflow process to form a single electrical and mechanical interconnection between each corresponding pair of contact pads 14A–14D and 18A–18D respectively (e.g., contact pads 14A and 18A forming a corresponding pair) shown generally as skewed conductive columnar members 26A–26D.

While lying generally along the oblique axes 23, the columnar members 26A–26D do not necessarily exhibit a linear geometry as they extend from the first component 10 and the mating component 20. Rather, the columnar members 26A–26D may result in a structure exhibiting a generally curvilinear geometry, or a curved profile, as they extend between a given pair of corresponding contact pads 14A–14D and 18A–18D.

As discussed above, the arrangement of "offsets" is desirably symmetrical such that columnar members 26A and 26B on the left of axis 16B mirror columnar members 26C and 26D located to the right of axis 16B. Such a symmetrical arrangement enables the columnar members 26A–26D to be formed without requiring both the first component 10 and the mating component 20 to be held captive during formation of the columnar members 26A–26D. This is because tension forces generated during the formation thereof will be substantially equally and symmetrically distributed about the center of the electronic device 12, thus offsetting one another.

Figure 2C:
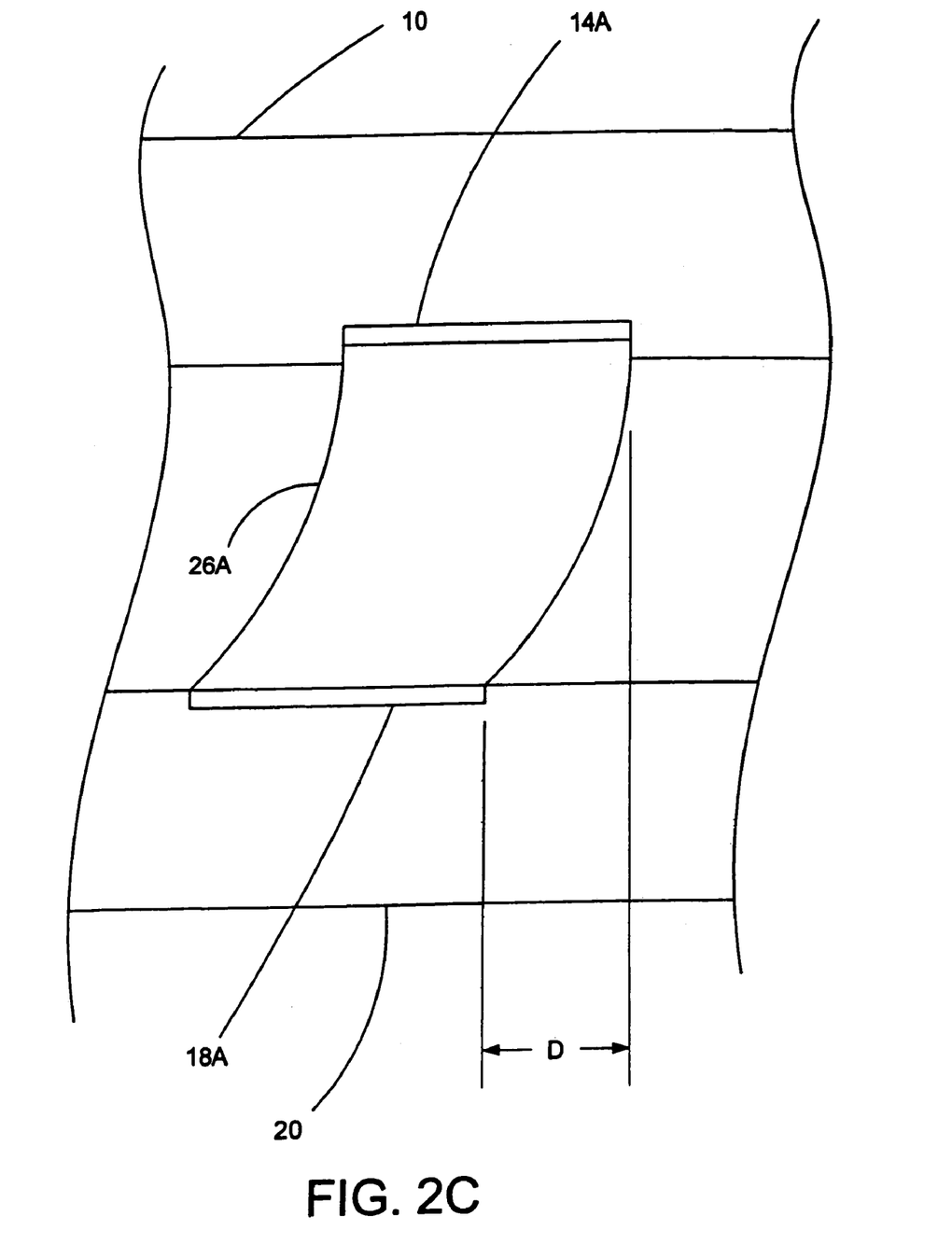
FIG. 2C is an enlarged detail of a section of a solder connection between the two components as indicated in FIG. 2B.

Referring to FIG. 2C, the intentional offset between a corresponding pair of contact pads 14A and 18A may be more easily seen. The offset is represented by a horizontal displacement distance "D" between peripheral edges of the two contact pads 14A and 18A (although other points of reference, such as contact pad centers, may be appropriately used). An exemplary distance D of such an offset may include approximately 30 to 150 microns and, more desirably, between 60 and 120 microns, although other relative offset distances and ranges thereof may be implemented.

As discussed above, conventional columnar or bump-type interconnections which are formed between corresponding pairs of contact pads are aligned with one another rather than offset relative to one another. In forming such a conventional interconnection, it is desirable and usually necessary to maintain such alignment within a tight tolerance to ensure robust and operative connections between the contact pads of each pair. For example, conventionally it has been desirable to maintain alignment between a pair of corresponding contact pads to ±25 microns. Thus, the present invention incorporates intentional offsets having an offset distance D which extends beyond the limits of conventional tolerances attempted to be maintained within the art as conventionally practiced.

The distance D of the offset may depend on particular design parameters such as, for example, the calculated or experimentally (empirically) determined mismatch of CTE between the first component 10 and the mating component 20 and/or the distance between the center of the first component 10 and the particular contact pad 14A, as will be discussed in more detail below.

Furthermore, the offset distance D may be defined as a predetermined ratio with respect to the size of conductive bumps 22. For example, if a conductive bump 22 (FIG. 2A) exhibits a nominal diameter of approximately 840 microns (approximately 33 mils), then the offset may be defined as a ratio of $1/7$, meaning that the offset distance D is $1/7^{th}$ the nominal diameter of the conductive bump 22 (approximately 120 microns), although other ratios may be utilized.

Referring back to FIG. 2B, it is noted that the contact pads 18A–18D of the mating component 20 are displaced outwardly relative to the contact pads 14A–14D of the first component 10. However, as noted above, the contact pads 18A–18D of the mating component 20 could be arranged and located so as to be displaced inwardly with respect to the contact pads 14A–14D of the first component 10. Such relative location or direction of displacement may be defined so as to induce a specific stress state in the resulting columnar members 26A–26D if desired. For example, if the first component 10 is determined to expand at a rate greater than the mating component 20, the columnar members 26A–26D may be placed in a primarily tensile or primarily compressive stress state upon such relative contraction depending on the orientation of the columnar member's skew angle as represented by the oblique axes 23. Thus, depending on material properties and other factors, it may be desirable to design the magnitude and orientation of the angle of skew of individual columnar members 26A–26D so as to induce a desired stress state upon relative expansion and/or contraction of the first component 10 and mating component 20. It is currently believed that a compressive stress state results in a more robust structure for columnar members 26A–26D, as thermal cycling of electronic device 12 would then ultimately result in only a neutral stress state as opposed to placing columnar members 26A–26D in tension.

Figure 3:
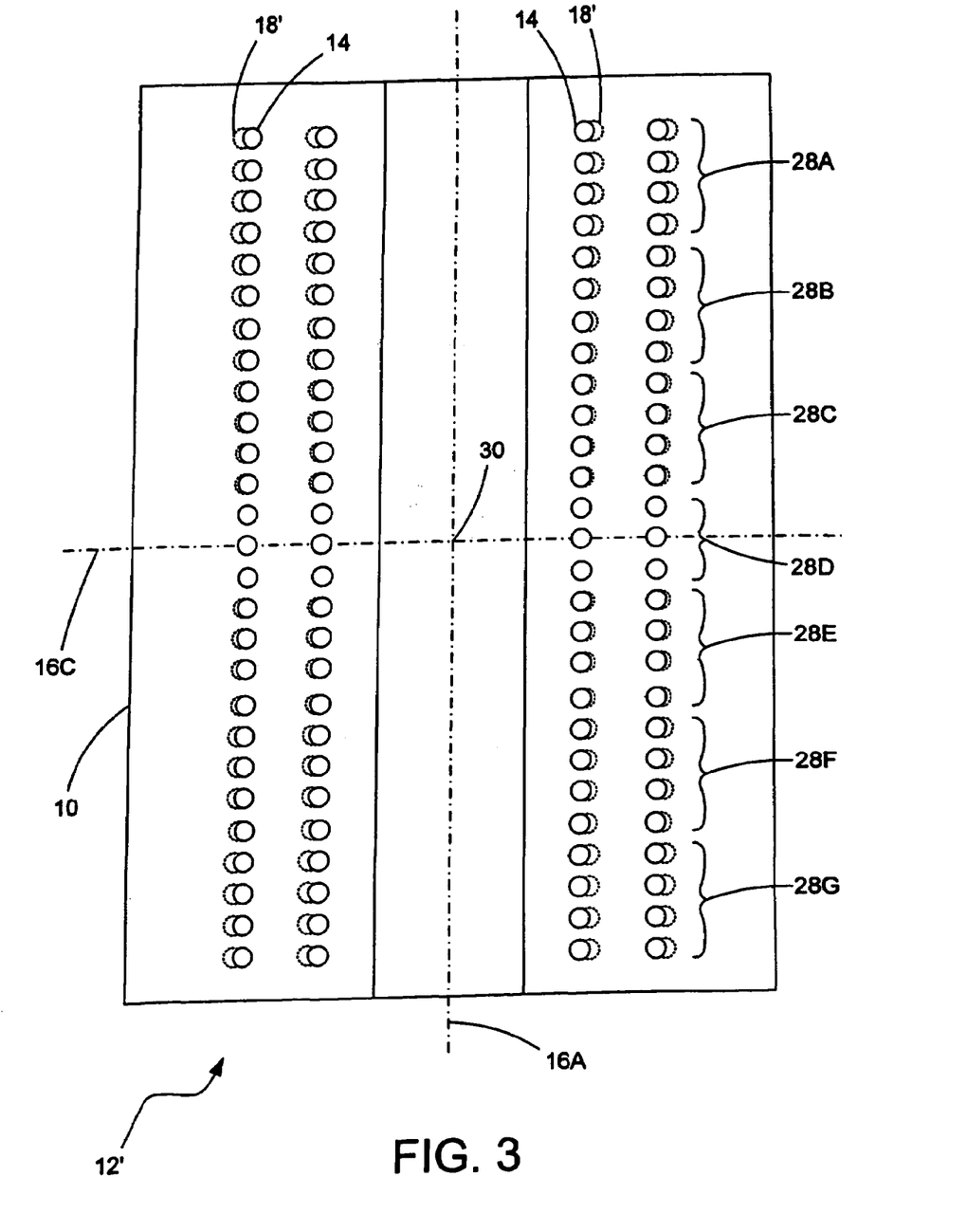
FIG. 3 is a top plan view of a first component of an electronic device having an array of contact pads and showing the superimposed location of corresponding contact pads from a mating component according to another embodiment of the present invention.

Referring now to FIG. 3, a top plan view of the first component 10 of an electronic device 12' is shown incorporating an offset arrangement of corresponding contact pads 14 and 18' according to another embodiment of the present invention. The contact pads 18' of a mating component (mating component not shown in FIG. 3 for clarity) may be arranged in sets 28A–28G which differ from one another in terms of the magnitude of their respective offset distances relative to corresponding contact pads 14 of the first component 10. For example, since the effects of thermal expansion of the first component 10 will be greater for a contact pad which is farther from the center 30 thereof (as defined by the intersection of the longitudinal axis 16A and a transverse axis 16C), it may be desirable to tailor the offset distances of corresponding contact pads 14 and 18' depending on their relative distance from the center 30 of the device 12'. Thus, for example, the sets of corresponding contact pads 28A and 28G, which are farthest from the center 30 of the first component 10, may exhibit the greatest degree of offset. On the other hand, the set of contact pads 28D which is closest to center 30 of the first component 10 may exhibit the least amount of offset and, as represented in FIG. 3, may not exhibit any relative offset, instead being aligned as in more conventional electrical interconnections. Other sets of contact pads 28B, 28C, 28E and 28F may exhibit intermediate relative offset distances based on their location with respect to the center 30 of the first component 10.

It is noted that the arrangement of relative offset distances between corresponding contact pads 14 and 18' desirably maintains a symmetry about the longitudinal axis 16A and, in the embodiment shown, actually exhibits symmetry about the transverse axis 16C as well.

Figure 4:
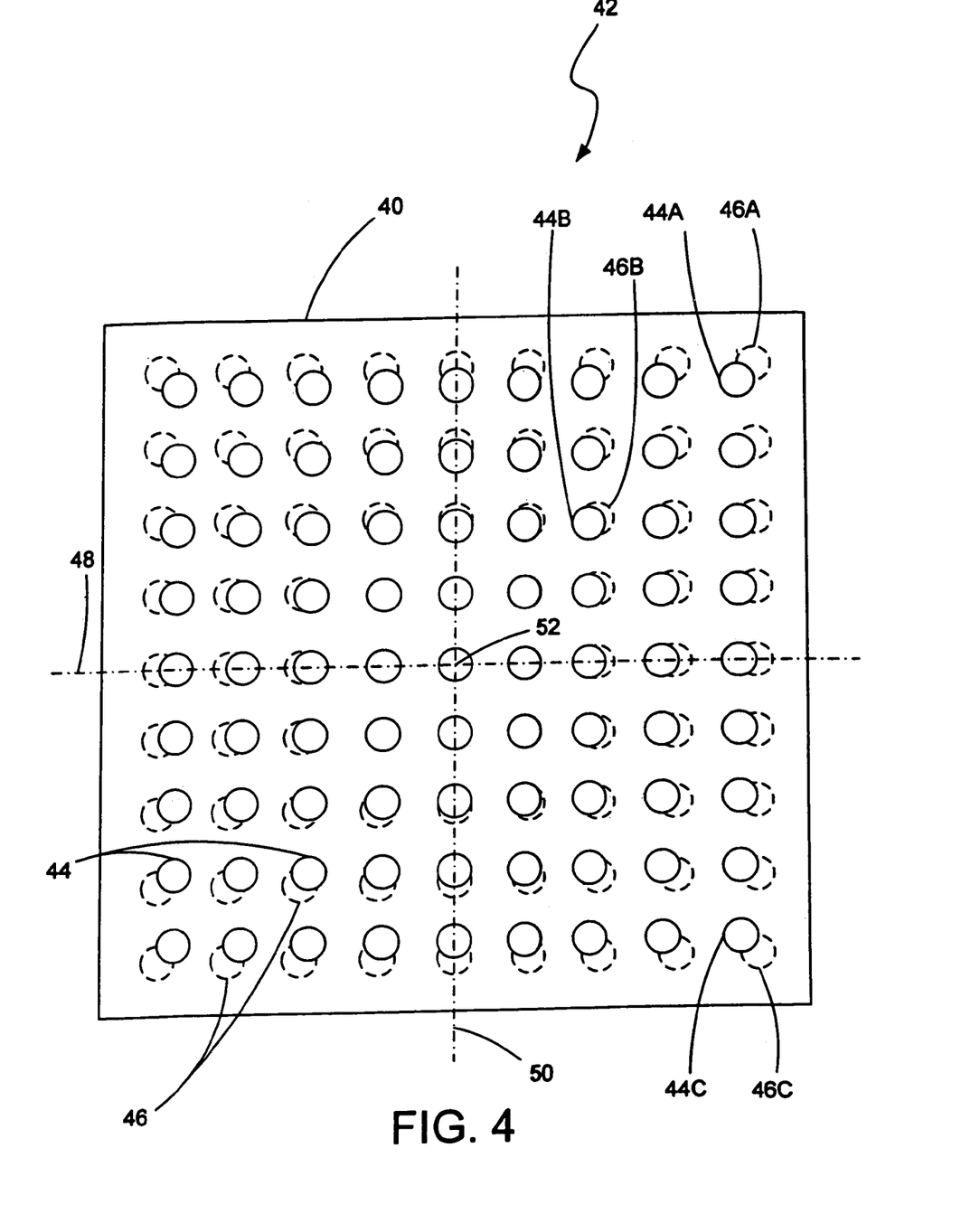
FIG. 4 is a top plan view of a first component of an electronic device having an array of contact pads and showing the superimposed location of corresponding contact pads from a mating component according to yet another embodiment of the present invention.

Referring now to FIG. 4, a top plan view of the first component 40 of an electronic device 42 is shown incorporating an offset arrangement of corresponding contact pads 44 and 46 according to another embodiment of the present invention. The first component 40 includes a plurality of contact pads 44 formed on a surface thereof, each of which may be electrically coupled to circuitry (not shown) formed in the first component 40. The plurality of contact pads 44 of the first component 40 is arranged symmetrically about a first axis 48, which may be referred to as the X-axis for purposes of convenience, and a second axis 50, which may be referred to as the Y-axis, with the two axes 48 and 50 intersecting with one another at the center 52 of the first component 40.

The relative position of the plurality of contact pads 46 (shown in dashed lines) of a mating component (not shown in FIG. 4 for clarity) is superimposed over the contact pads 44 of the first component 40. The locations of individual contact pads 46 of the mating component are offset such that they are displaced from, relative to corresponding contact pads 44 of the first component 40, both the X-axis 48 and the Y-axis 50. Furthermore, the magnitude of the relative offset between any two corresponding contact pads 44 and 46 is determined with respect to a particular contact pad's distance from the center 52 of the first component 40 (or, in some instances, the center of the electronic device 42).

For example, contact pad 46A is offset, relative to contact pad 44A, in a direction which is upward and to the right according to the view shown in FIG. 4 and described with respect to its relative location to the X-axis 48 and the Y-axis 50. Similarly, contact pad 46B is offset, relative to contact pad 44B, in a similar direction, but through a smaller magnitude of displacement due to its relative closeness to the center 52 of the first component 40 as compared to contact pad 46A.

Furthermore, contact pad 46C is offset, relative to contact pad 44C, in a direction which is downward and to the right according to the view shown is FIG. 4 and described with respect its relative location to the X-axis 48 and the Y-axis 50. However, the magnitude of relative displacement of contact pad 46C is similar to the magnitude of relative displacement of contact pad 46A due to their similar distances from the center 52 of the first component 40. Thus, the offset arrangement is symmetrical about the center 52 of the first component 40 (i.e., about both the X-axis 48 and the Y-axis 50) both in terms of magnitude and direction of offsets.

Figure 5:
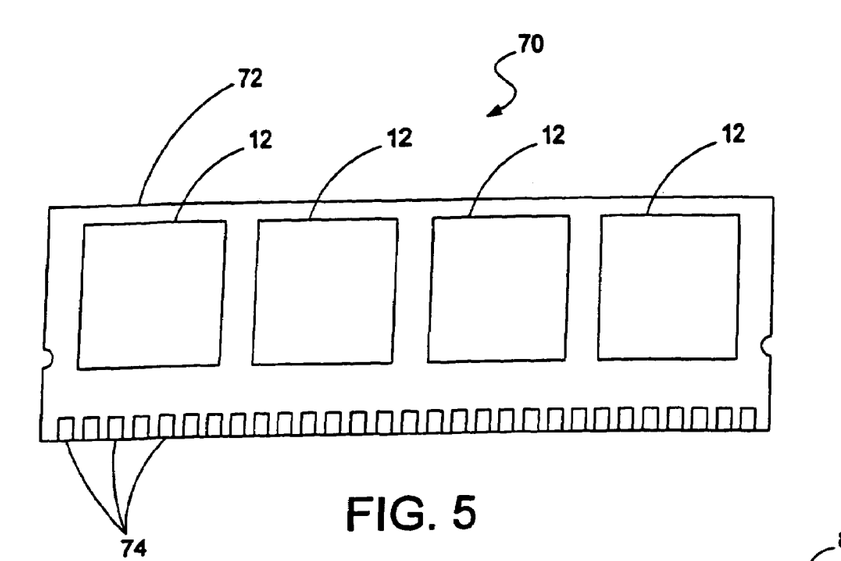
FIG. 5 shows a memory device incorporating an electronic device according to an aspect of the present invention.

Referring now to FIG. 5, a memory device 70, also referred to as a memory module, is shown which incorporates an electronic device 12 according to the present invention. The memory device 70 includes a carrier substrate 72, such as a PCB, to which one or more electronic devices 12, such as stacked array components or other packaged semiconductor dice including first and second components joined in accordance with the present invention, may be electrically and mechanically operably coupled therewith. A plurality of electrical connectors 74, shown as edge connectors by way of example only, is formed on the carrier substrate 72 to provide input and output connections from an external device, such as, for example, the motherboard of a computer, to the one or more electronic devices 12. In another embodiment, the memory device 70 may be representative of the electronic device 12 in the sense that the carrier substrate 72 may itself act as the "mating component" as described above herein and wherein a semiconductor device is coupled to the carrier substrate 72 to form skewed columnar interconnections as described above. Of course, electronic devices 12' or 42 may also be incorporated in a memory device 70.

Figure 6:
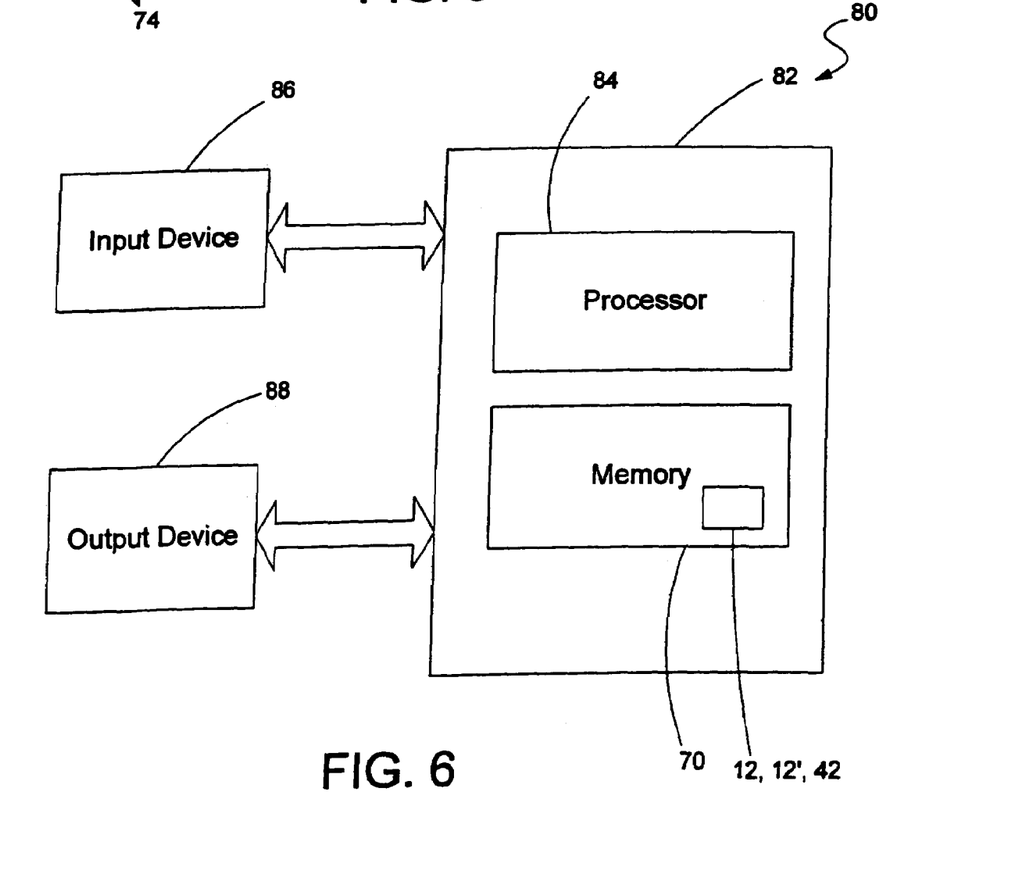
FIG. 6 shows a computing system incorporating an electronic device according to an aspect of the present invention.

Referring now to FIG. 6, a computing system 80 is shown which includes a carrier substrate 82 such as, for example, a motherboard. The carrier substrate 82 may be operably coupled to at least one processor 84, such as, for example, a central processing unit (CPU) and at least one memory device 70. The memory device 70 may include one or more electronic devices 12, 12' and 42 incorporating electrical connections according to the present invention such as described above. The carrier substrate 82 is operably coupled with at least one input device 86 such as, for example, a keyboard, a mouse, a sensor or another computing device. The carrier substrate 82 is also operably coupled with at least one output device 88 such as, for example, a printer, a monitor, an actuator or another computing device. In another embodiment, a semiconductor device (e.g., the processor 84) may be directly coupled to the carrier substrate 82 to form skewed columnar interconnections as described above herein (e.g., the processor 84 is the "first component" and the carrier substrate is the second "mating component" of the above-described embodiments).

It is noted that while some of the above-described embodiments and examples have been set forth in terms of semiconductor devices and, more particularly, BGA- and CGA-type devices, the present invention is applicable to any device utilizing electrical array interconnection technology. Furthermore, the present invention is particularly well suited for use with devices requiring long life expectancies. For example, as will become more apparent upon reading the specific Example below, the electrical connections formed according to the present invention exhibit a fatigue life which exceeds the current 20 year telecom industry specification.

EXAMPLE

Figure 7:
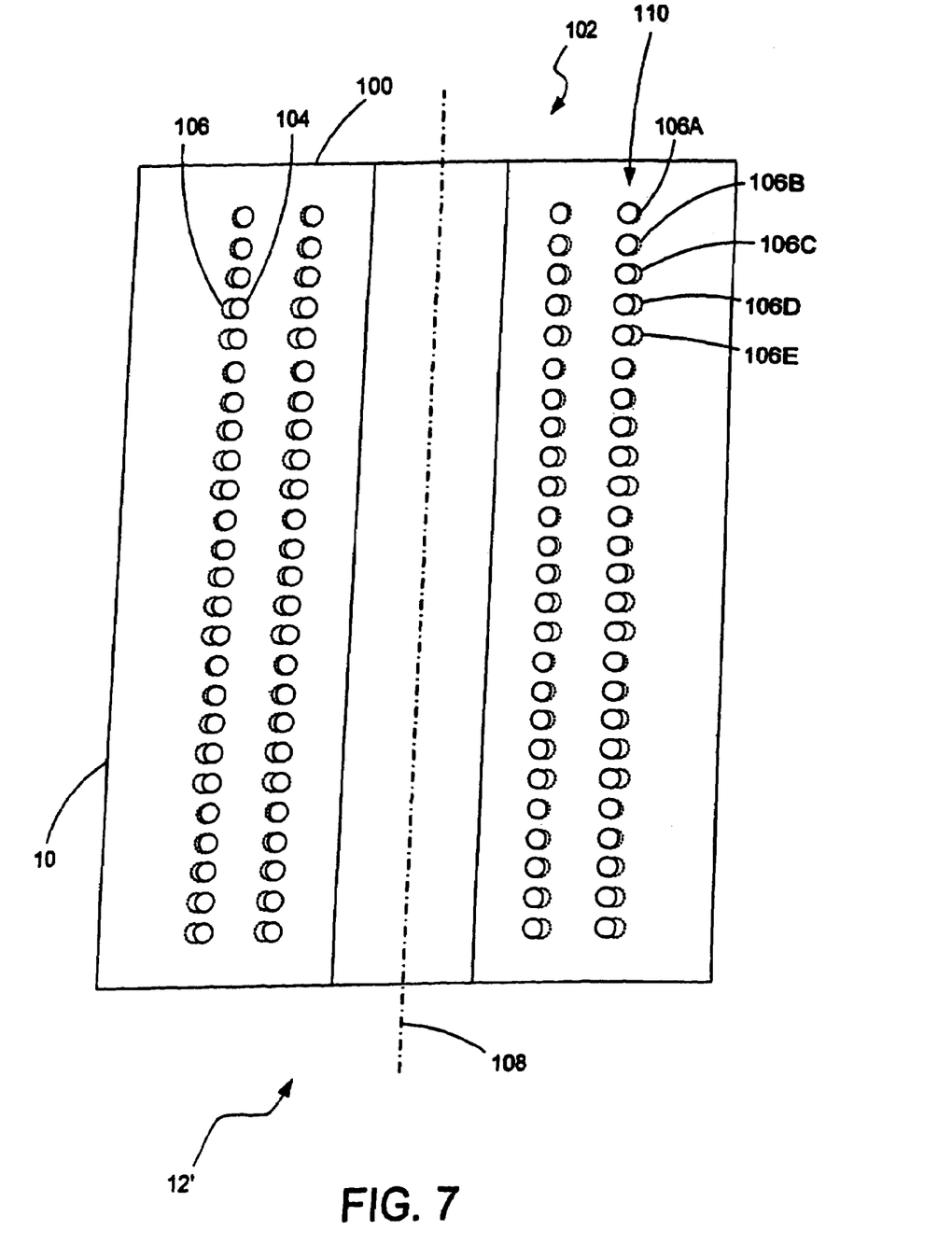
FIG. 7 shows a top plan view of a first component of an electronic device.

Referring to FIG. 7, a top plan view of the first component 100 of an electronic device 102 is shown which incorporates an offset arrangement of corresponding contact pads 104 and 106 (contact pads 106 shown in broken lines) according to an embodiment of the present invention. The electronic device 102 according to the presently described embodiment was used in testing to determine the fatigue life of electrical interconnections formed between the offset contact pads 104 of the first component 100 and the contact pads 106 of a mating component (not shown in FIG. 7 for clarity). The contact pads 106 of the mating component are symmetrically arranged about a longitudinal axis 108 such that relative offset distances between a pair of corresponding contact pads 104 and 106 are varied in a repeating pattern.

For example, looking at an outer row 110 of mating or corresponding contact pads 104 and 106, the contact pads 106 of the mating component were arranged such that the first contact pad 106A exhibited an offset of 30 microns relative to the corresponding contact pad 104 of the first component 100; the second contact pad 106B exhibited a relative offset of 60 microns; the third contact pad 106C exhibited a relative offset of 90 microns; the fourth contact pad 106D exhibited a relative offset of 120 microns; and the fifth contact pad 106E exhibited a relative offset of 150 microns. This relative offset pattern then repeated itself through the remainder of the outer row 110 in what may be termed a "Christmas-tree" pattern.

A semiconductor device was used as the first component 100 and included a conventional fine-pitch ball grid array (FBGA)-type device having a bismaleimide-triazine (BT) substrate as will be appreciated by those of ordinary skill in the art. The mating component (not shown) to which the first component 100 was coupled included a conventional FR-4 PCB as will also be appreciated by those of ordinary skill in the art. The columnar members (not shown in FIG. 7) formed between the contact pads 104 of the first component 100 and the contact pads 106 of the mating component were formed of a Sn63-Pb37 composition solder.

The test included subjecting the electronic device 102 to repeated temperature cycles in an attempt to induce thermal fatigue into the columnar members. Each cycle comprised a fifteen (15) minute cold dwell at 0° C., a seven and a half (7.5) minute transition from 0° C. to 100° C., a fifteen (15) minute hot dwell at 100° C., and a seven and a half (7.5) minute transition from 100° C. to 0° C.

In performing the test, it was discovered that the skewed columnar members formed between relatively offset contact pads 104 and 106 exhibited superior fatigue life properties. For example, it was noted that the solder columns having offsets between 60 microns and 120 microns may exceed 7,000 cycles before a 60% failure rate is realized. Such fatigue life is considered to be excellent in the electronics and semiconductor industry as it is estimated that such test results extrapolate to a fatigue life of approximately 30 to 35 years in real time use.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention includes all modifications, equivalents, and alternatives falling within the spirit and scope of the invention as defined by the following appended claims.

What is claimed is:

1. A method of fabricating an electronic device, the method comprising:
    providing a first component having a first plurality of contact pads patterned on a face surface thereof;
    providing a second component having a second plurality of contact pads patterned on a face surface thereof including:
        arranging each of the second plurality of contact pads to correspond with an associated one of the first plurality of contact pads when the face surface of the second component is placed in a confronting spaced relationship with the face surface of the first component,
        laterally offsetting a first contact pad of the second plurality of contact pads relative to its associated one of the first plurality of contact pads in a first direction, and
        laterally offsetting a second contact pad of the second plurality of contact pads relative to its associated one of the first plurality of contact pads in a second direction different from the first direction; and
    forming a plurality of conductive columnar members subsequent laterally offsetting a first contact pad and laterally offsetting a second contact pad, each conductive columnar member of the plurality interconnecting a contact pad of the second plurality of contact pads and its associated one of the first plurality of contact pads.

2. The method according to claim 1, further comprising substantially symmetrically locating the first contact pad and the second contact pad of the second plurality of contact pads about a defined axis of the electronic device.

3. The method according to claim 2, wherein laterally offsetting the second contact pad further includes laterally offsetting the second contact pad by a distance of approximately 30 microns to 150 microns relative to its associated one of the first plurality of contact pads.

4. The method according to claim 1, further comprising defining the second direction to be opposite of the first direction.

5. The method according to claim 1, wherein laterally offsetting the first contact pad further includes laterally offsetting the first contact pad by a distance of approximately 30 microns to 150 microns relative to its associated one of the first plurality of contact pads.

6. The method according to claim 1, wherein laterally offsetting the first contact pad further includes laterally offsetting the first contact pad by a distance of approximately 60 microns to 120 microns relative to its associated one of the first plurality of contact pads.

7. The method according to claim 6, wherein laterally offsetting the second contact pad further includes laterally offsetting the second contact pad by a distance of approximately 60 microns to 120 microns relative to its associated one of the first plurality of contact pads.

8. The method according to claim 1, wherein forming the plurality of conductive columnar members further comprises:
   forming a first plurality of conductive bumps disposed on the first plurality of contact pads;
   forming a second plurality of conductive bumps disposed on the second plurality of contact pads;
   contacting each of the first plurality of conductive bumps with an associated one of the second plurality of conductive bumps; and
   melding each of the first plurality of conductive bumps with its associated one of the second plurality of conductive bumps.

9. The method according to claim 8, further comprising forming each of the first plurality of conductive bumps and each of the second plurality of conductive bumps of a solder composition.

10. The method according to claim 9, wherein melding each of the first plurality of conductive bumps with is associated one of the second plurality of conductive bumps includes reflowing the solder composition of at least one of the first plurality of conductive bumps and the second plurality of conductive bumps.

11. The method according to claim 9, further comprising defining the solder composition of the first plurality of conductive bumps and the second plurality of conductive bumps to include 63 percent tin and 27 percent lead by weight.

12. The method according to claim 8, further comprising forming the first plurality of conductive bumps and the second plurality of conductive bumps of a material comprising gold.

13. The method according to claim 1, further comprising laterally offsetting a majority of the second plurality of contact pads relative to their associated ones of the first plurality of contact pads.

14. The method according to claim 13, further comprising arranging the majority of the second plurality of contact pads which are laterally offset relative to their associated ones of the first plurality of contact pads in a pattern which is substantially symmetrical about a defined axis of the electronic device.

15. The method according to claim 13, further comprising arranging the majority of the second plurality of contact pads which are laterally offset relative to their associated ones of the first plurality of contact pads in a pattern which is substantially symmetrical about a center of the electronic device.

16. The method according to claim 1, wherein providing a first component further comprises providing a semiconductor device and wherein providing a second component further comprises providing a carrier substrate.

* * * * *

UNITED STATES PATENT AND TRADEMARK OFFICE
CERTIFICATE OF CORRECTION

| | |
|---|---|
| PATENT NO. | : 7,213,330 B2 |
| APPLICATION NO. | : 10/921422 |
| DATED | : May 8, 2007 |
| INVENTOR(S) | : John L. Caldwell and William J. Casey |

Page 1 of 1

It is certified that error appears in the above-identified patent and that said Letters Patent is hereby corrected as shown below:

COLUMN 1,   LINE 60,      change "bum-in" to --burn-in--
               COLUMN 6,   LINE 12,      change "BGAZ-" to -- BGA- --
               COLUMN 11,  LINE 1,       change "carrier substrate is" to
                                                                     --carrier substrate 82 is--

CLAIM 10,    COLUMN 13,  LINE 21,      change "with is" to --with its--

Signed and Sealed this

Twentieth Day of November, 2007

JON W. DUDAS
*Director of the United States Patent and Trademark Office*